United States Patent [19]

Fitz

[11] Patent Number: 4,825,442
[45] Date of Patent: Apr. 25, 1989

[54] PLANAR OPTICAL LOGIC

[75] Inventor: John L. Fitz, Riverdale, Md.

[73] Assignee: U.S. Government as represented by Director, National Security Agency, Fort George G. Meade, Md.

[21] Appl. No.: 183,218

[22] Filed: Apr. 19, 1988

[51] Int. Cl.$^4$ ................................................. H01S 3/30
[52] U.S. Cl. ......................................... 372/8; 372/45; 372/64
[58] Field of Search ........................ 372/8, 45; 328/64

[56] References Cited

U.S. PATENT DOCUMENTS

| | | |
|---|---|---|
| 3,430,160 | 2/1969 | Kosonocky . |
| 3,431,437 | 3/1969 | Kosonocky . |
| 3,439,289 | 4/1969 | Kosonocky ............................. 372/8 |
| 3,538,452 | 11/1970 | Kosonocky . |
| 4,592,057 | 5/1986 | Comerford ............................. 372/8 |
| 4,603,420 | 7/1986 | Nishizawa et al. ................... 372/45 |

OTHER PUBLICATIONS

Lasher; "Use of Active Filaments in Improving the Quenching Act and Bistable Operat. of Inject. Lasers"; IBM Tech. Disc. Bull. vol. 7 (9), 2/65.
Kelly; "Solid State Exclus. or Device"; IBM Tech. Disc. Bull., vol. 7(11); Apr. 65.
Lasher; "Mutually Quenched Inject. Lasers as Bistable Devices"; IBM Journal; Sep. 1964.
Williams et al.; "Threshold Logic in Multicontact Inj. Lasers"; IBM Tech. Discl. Bull. vol. 7, (9); Feb. '65.
Kelly, Solid State Exclusive or Device, "IBM Tech. Discl. Bul." vol. 7, No. 11, Apr. 1965, p. 1073.

Primary Examiner—Léon Scott, Jr.
Attorney, Agent, or Firm—John R. Utermohle; Thomas O. Maser

[57] ABSTRACT

An optically controlled laser device is used to perform digital logic functions. The device comprises a single mode semiconductor laser including a waveguide for coupling light into the lasing caving at an angle at or near normal incidence with respect to the laser radiation generated by the laser. The single mode properties of the laser are achieved by index guiding. The coupled light interacts with the laser radiation in a small region of the lasing cavity creating a perturbation that quenches the laser output, whereby input of the coupled light enables the laser device to perform logic functions.

9 Claims, 2 Drawing Sheets

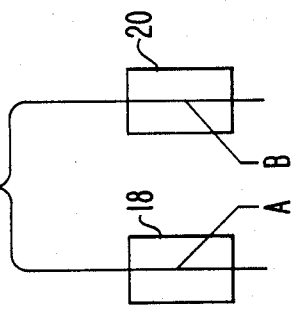
FIG. 4a (NOR)
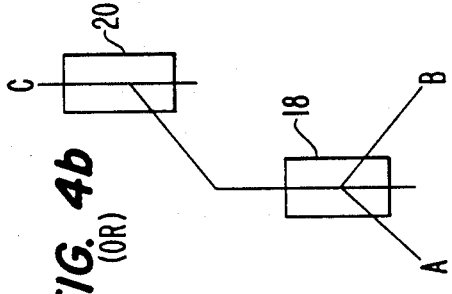
FIG. 4b (OR)
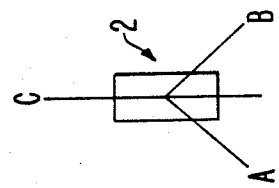
FIG. 4c (NAND)
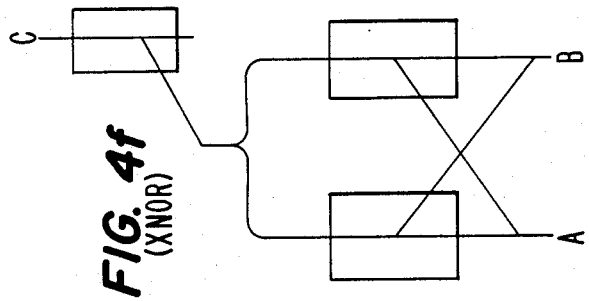
FIG. 4d (AND)
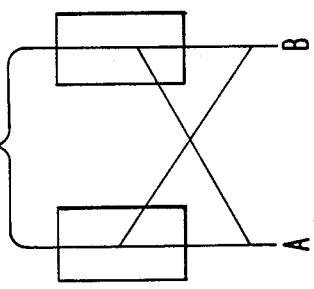
FIG. 4e (XOR)
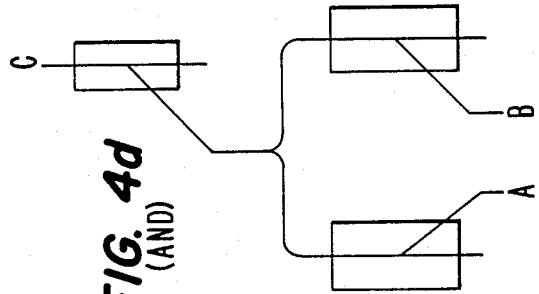
FIG. 4f (XNOR)

PLANAR OPTICAL LOGIC

FIELD OF THE INVENTION

The present invention relates to a planar optical logic device that uses an optically controlled laser (OCL) to perform different logic functions.

BRIEF DESCRIPTION OF THE PRIOR ART

Electrical devices for performing digital logic functions have been in existence for many years. These devices require a change in an electrical signal to perform the logic function, but are limited in their speed of operation by traditional RC time constants.

Accordingly, optical devices for performing logic functions were developed, as evidenced by the laser digital device disclosed in the Kosonocky U.S. Pat. No. 3,430,160. This device is pumped with an alternating current to operate as a regenerative laser amplifier and includes two separate resonant structures. Each resonant structure has a separate input signal for excitation. If one of the input signals is a clock pulse, the device can act as either an OR circuit or as a NOR circuit.

Another optical system for performing digital logic is disclosed in the Kosonocky U.S. Pat. No. 3,431,437. A semiconductor laser diode has a planar junction region adapted for coherent light signal amplification in one direction and for laser oscillation in a second transverse direction. The amplified input light quenches the laser oscillations over a broad depopulation area and cuts off the output, whereby the device operates as an inverter logic element.

While the prior devices operate satisfactorily, they suffer from certain inherent drawbacks which limit their response time and efficiency. For example, the prior devices depopulate within the entire volume or, at a minimum, within a substantial portion of the laser cavity which slows the response of the device and which presents problems for waveguide integration to other devices. Furthermore, the prior devices require coherent light for operation.

The present invention was developed in order to overcome these and other drawbacks of the prior devices by providing a single mode semiconductor laser that includes a device for coupling light into the laser cavity for interaction with the laser media to cause a perturbation. The perturbation takes the form of a localized attenuation or a variation in the gain and index of refraction within the interaction region of the laser cavity causing a quench in the laser output. This quench of the laser output allows the use of the optically controlled laser as a digital logic device that requires no alternating electrical currents for operation.

SUMMARY OF THE INVENTION

Accordingly, it is a primary object of the present invention to provide an optically controlled semiconductor laser for performing digital logic functions. The optically controlled laser includes a material dependent index guided, single mode laser diode device including a waveguide lasing cavity having a longitudinal axis. The laser diode generates laser radiation within the cavity in a direction parallel with the axis. A light coupling waveguide device is connected with the lasing cavity for coupling light into the cavity at an angle greater than the numerical aperture of the laser diode along the longitudinal axis. The light interacts with the laser media in a small region of the cavity adjacent the coupling waveguide to alter the output of the laser device. By injecting the light for interaction into the laser media, the device performs logic functions.

The addition of a second coupling waveguide and the combination of a plurality of optically controlled lasers increases the types of logic functions which may be performed.

In accordance with another object of the invention, the length of the interaction region within the lasing cavity corresponds with the width of the coupling waveguide, thereby defining a narrow interaction region. This region increases the speed of operation of the device and allows for waveguide integration between OCL devices.

A still further object of the invention is to allow integration of multiple OCL devices in which the width of the laser waveguide is optimally the same width as the coupling waveguide.

BRIEF DESCRIPTION OF THE FIGURES

Other objects and advantages of the subject invention will become apparent from a study of the following specification when viewed in the light of the accompanying drawing, in which:

FIGS. 4a-f are block diagrams illustrating the various logic functions performed by various combinations of optically controlled lasers according to the invention.

DETAILED DESCRIPTION

Figure 3:
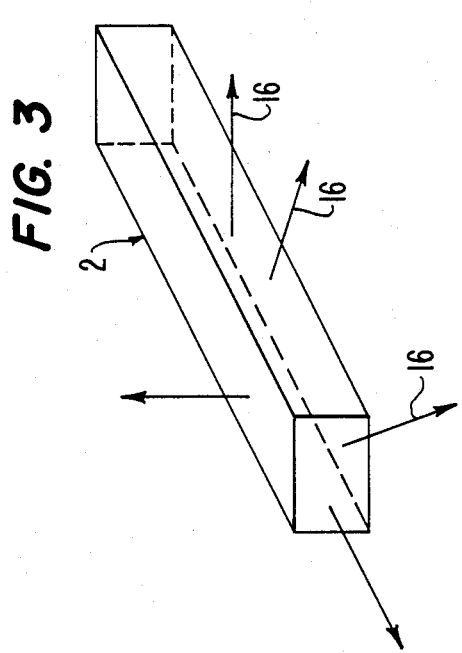
FIG. 3 is a perspective view of the optically controlled laser according to the invention in a spontaneous mode of operation.

The optically controlled laser in accordance with the present invention will initially be described with reference to FIG. 1. As shown therein, the laser device 2 includes a material dependent index guided single mode laser diode including a lasing or laser cavity 4 having a longitudinal axis 6. At each end of the cavity are provided laser facets 8. The laser device, which is preferably a semiconductor laser, generates laser radiation within the cavity in a direction parallel with the longitudinal axis.

A characterizing feature of the optically coupled laser is that a waveguide lasing cavity is formed that will only support one mode, thereby defining a single mode laser diode. Mode confinement of the semiconductor diode is derived from refractive index variations within the laser diode material, hereinafter referred to as index guiding. The strong guiding provided by index guiding presents a physical limitation on which modes are allowed within the laser cavity. Index guiding of modes is independent of any perturbations from external optical inputs. The single mode allowed within the index guided structure is fixed by the index profile, thereby cutting off all higher order modes.

This is in contrast to the single mode laser diode structures that use the gain of the device to provide mode confinement. These devices are known as gain guided single mode laser diodes wherein the guiding provided is dependent upon gain. This type of guiding varies as the gain of the device is changed. Since a perturbation from an external optical input is in the form of a localized change in the gain, it is possible that the guiding of higher order modes will be allowed in gain guided structures when a perturbation is introduced into the laser cavity.

Referring once again to FIG. 1, an optical waveguide 10 which may be active or passive is connected with the laser device 2 for optically coupling light into the laser cavity at an angle greater than the longitudinal axis numerical aperture of the laser device. In FIG. 1, the coupling angle is 90° relative to the longitudinal axis. The light coupled into the laser cavity is close to the center wavelength of the laser radiation resulting in an interaction between the coupled light and the laser media in the region 12 where the light and the laser media overlap. It is noted from FIG. 1 that the length of the interaction region corresponds with the width of the waveguide which constitutes a very small portion of the total volume of the laser cavity. To integrate multiple OCL devices, an optimal configuration would have the width of the laser waveguide the same as the width of the coupling waveguides. This would allow maintenance of the single mode properties of the light that is output from one OCL and used as an input to another OCL. The interaction between the laser media and the coupled light is in the form of a perturbation which will be discussed in greater detail below. For proper interaction, the coupled light must have a peak wavelength that is within the spontaneous emission bandwidth of the laser radiation, although the coupled light need not be coherent with respect to the laser radiation.

The active atoms within the interaction region of the optically coupled laser are pumped into excited states by an applied DC current (not shown). When no light is coupled into the interaction region, the OCL behaves as a standard laser diode. However, the excited active atoms within the interaction region can be stimulated to emit in directions other than in the lasing direction parallel to the cavity axis. Accordingly, light coupled into the interaction region stimulates the excited active atoms forcing them to emit in a direction other than the lasing direction. This off axis stimulation causes a perturbation in what was previously a uniform waveguide. The perturbation takes the form of a localized attenuation or a variation in the gain and index of refraction within the interaction region of the laser cavity.

Figure 2:
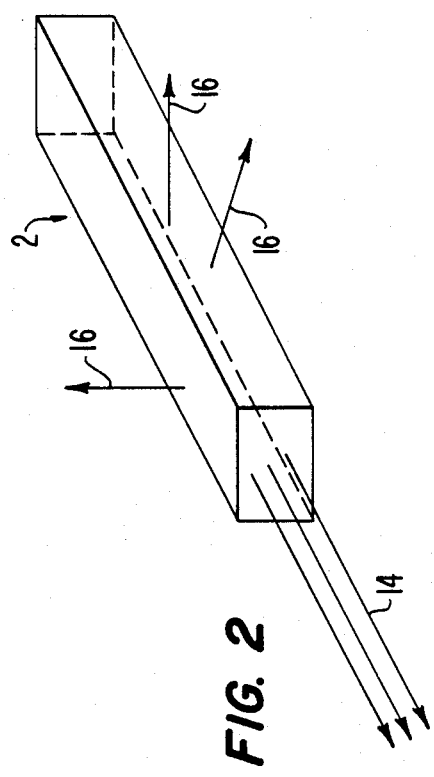
FIG. 2 is a perspective view of the optically controlled laser according to the invention in a stimulated emission mode of operation.

It is known that a single mode operation of a laser diode is very sensitive to a perturbation which tends to disrupt the single mode properties of the device. However, because the laser waveguide is index guided, the laser cavity is physically restricted to single mode operation, thereby preventing a shift to multi-mode operation of the laser. Therefore, a perturbation in the laser cavity will force the laser to shift from a stable, guided single mode to an unguided mode, typically envisioned as a radiation mode. This means that the laser will shift from predominantly stimulated emission during single mode operation to predominantly spontaneous emission during perturbation. In the stimulated emission mode shown in FIG. 2, most photons exit the ends of the laser cavity as stimulated emission 14 with a small portion of the photons exiting the cavity as spontaneous emission 16. In the spontaneous emission mode of operation shown in FIG. 3, the photons exit the cavity in random directions as spontaneous emissions.

The shift from stimulated to spontaneous emission causes a significant decrease or quench in the output intensity of the laser. The decrease in the amount of light output from the OCL can exceed the amount of light coupled into the OCL. This occurs when the index mode confinement is very strong and all modes above the single operational mode are well into cutoff for the laser cavity waveguide set up by the index guiding. This corresponds to a net gain in the operation of the device, whereby no amplification is required in the input signal and fanout of the output signal of the device is provided, with the number of fanouts being related to the net gain of the OCL. Thus it is evident that the use of index guided structures for the optically controlled laser is crucial for efficient operation of the device as a logic element.

As set forth above, when the optically controlled laser is perturbed and forced into spontaneous emission, the direction of spontaneously emitted photons is random as shown in FIG. 3. Accordingly, the probability of a photon exiting from an end facet of the laser cavity is proportional to the area of the end facets divided by the total surface area of the laser active region. If the area of the two end facets is small with respect to the total surface area of the box that forms the active region, then the number of photons exiting the two end facets will be greatly reduced when the laser shifts from predominantly stimulated emission (i.e., no perturbation) to predominantly spontaneous emission (when light is injected into the active region off axis). The depth of modulation of the OCL is thus the ratio of the number of photons exiting the end facets during lasing divided by the number of photons exiting the end facts when the off axis beam has forced the laser into spontaneous emission. This ratio is referred to as the quench ratio, and the optically controlled laser according to the invention is capable of attaining quench ratios greater than one.

LOGIC FUNCTIONS

Figure 1:
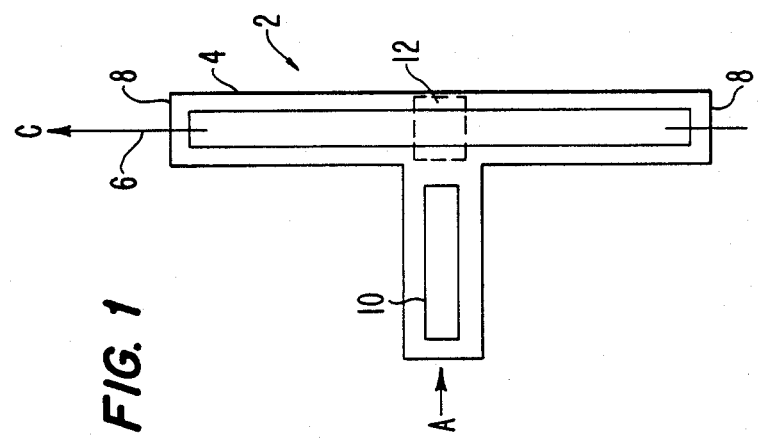
FIG. 1 is a simplified plan view of the optically controlled laser according to the invention.

If in FIG. 1 the coupled (off axis) light beam is labeled A and the output laser beam is labeled C, then as A increases, C decreases. Analyzed digitally, if A is a one, then C is a zero, and if A is a zero, then C is a one. This is the digital equivalent of an INVERT function.

If two beams are coupled into the lasing region, then a NOR function is possible as shown in FIG. 4a. Consider the two coupled light beams as A and B and the output laser beam as C. If either A or B is a one, then C is a zero. Therefore, the only time C is a one is when A and B are zero as shown in the following table:

| A | B | C |
| --- | --- | --- |
| 0 | 0 | 1 |
| 0 | 1 | 0 |
| 1 | 0 | 0 |
| 1 | 1 | 0 |

It is known that any logic function may be generated with NOR gates as the fundamental devices. Thus the optically controlled laser 2 of the present invention is capable of performing any logic function as shown in FIGS. 4b–4f.

In FIG. 4b, the OR logic function is illustrated using two OCL devices 18, 20. Light beams A and B coupled off-axis to the first device 18 produce an output which is coupled off-axis into the second device 20 to produce an output C. The logical operation of the combination is as follows:

| A | B | C |
|---|---|---|
| 0 | 0 | 0 |
| 0 | 1 | 1 |
| 1 | 0 | 1 |
| 1 | 1 | 1 |

In FIG. 4c, input beam A is coupled to a first OCL device 18 and input beam B is coupled to a second OCL device 20, the outputs of which are combined as C. This combination produces the NAND logic function as follows:

| A | B | C |
|---|---|---|
| 0 | 0 | 1 |
| 0 | 1 | 1 |
| 1 | 0 | 1 |
| 1 | 1 | 0 |

If FIG. 4d, three OCL devices are provided. Input beams A and B are coupled into separate OCL devices 18, 20, respectively, the outputs of which are combined to produce an off axis input to the third OCL 22 having an output C. Such a combination produces the AND function as follows:

| A | B | C |
|---|---|---|
| 0 | 0 | 0 |
| 0 | 1 | 0 |
| 1 | 0 | 0 |
| 1 | 1 | 1 |

FIG. 4e illustrates the production of an XOR function. Inputs A and B are both coupled into first and second OCL devices 18, 20 producing a combined output C. The device operates as follows:

| A | B | C |
|---|---|---|
| 0 | 0 | 0 |
| 0 | 1 | 1 |
| 1 | 0 | 1 |
| 1 | 1 | 0 |

Finally, FIG. 4f illustrates the XNOR function. This design is similar to that of FIG. 4e except that the combined outputs from OCL devices 18 and 20 are combined as an off axis input to OCL 22 to produce the output C. The logic operation is as follows:

| A | B | C |
|---|---|---|
| 0 | 0 | 1 |
| 0 | 1 | 0 |
| 1 | 0 | 0 |
| 1 | 1 | 1 |

Of course, the combinations of FIGS. 4e and 4f require access to the on axis gain medium as shown. That is, the devices 18 and 20 must be able to input light on axis and must be able to input light via the two off axis control ports.

As opposed to prior electrically operated logic devices whose speed of operation is limited to RC time constants, the only limiting factors in optically controlled lasers are the rates of population and depopulation of the excited states in the lasing medium. These rates are tied to atomic effects and are extremely fast, i.e. on the order of picoseconds. Even allowing for two orders of magnitude error, the OCL shows a potential for operation at speeds in the tens of gigahertz. The only electrical signal required is a constant current bias.

OPTICALLY CONTROLLED LASER FABRICATION

Although many fabrication techniques are possible, one such technique for manufacturing index guided optically controlled lasers will now be described.

This technique uses Multiple Quantum Well (MQW) laser diode epitaxial layers as the starting material. This requires the ability to fabricate or grow MQW layers on a host substrate. Presently, these layers are being fabricated using Molecular Beam Epitaxy (MBE) and Metal Organic Chemical Vapor Deposition (MOCV) epitaxy techniques. The epitaxial growth of MQW laser diodes has previously been demonstrated.

In the fabrication process, MQW lasers are chosen as the layer structure for the optically controlled laser devices because of their ability to be selectively disordered. This disordering provides both electrical and optical field confinement which is required to provide the stable single mode properties required by the optically controlled laser devices. The optical confinement provided by disordering allows the fabrication of index guided laser structures.

The steps for optically controlled laser fabrication are as follows:

(1) MQW laser growth

A multiple quantum well laser structure is epitaxially grown on a host substrate. This can be accomplished by MBE or MOCVD epitaxial growth techniques.

(2) Photoresist patterning to delineate laser areas

Standard photolithographic techniques are used to pattern photoresist in the top surface of the wafer the pattern of the OCL laser and waveguide regions.

(3) Diffusion/implant mask deposition

The photoresist of step 2 is used to pattern the diffusion/implant mask. The mask material is typically a dielectric such as silicon nitride. The silicon nitride covers the area of the MQW substrate where disordering is not to occur, i.e., where the OCL devices are to be fabricated.

(4) Impurity deposition/implantation

In this example, silicon is used as the impurity that will disorder the quantum wells. Many other impurities have been shown to produce disordering of quantum wells. However, silicon appears to have the best properties for disordering MQW laser structures.

Silicon is deposited on the surface of the laser substrate. The silicon is then thermally diffused into the MQW layers. The MQW layers are disordered by the silicon in the areas that were not protected by the silicon nitride mask. The silicon diffusion follows a typical thermal diffusion profile in terms of the distribution of silicon in the substrate after the diffusion step.

As an alternative to thermal diffusion, silicon can also be implated into the MQW layers. The implant mask may be something other than silicon nitride. After the implant, the substrate is annealed. The MQW layers are disordered by the combination of the implant/anneal steps.

The choice of disordering technique depends on the amount of lateral displacement required for the silicon when the disordering process is completed. In the case of thermal diffusion of silicon, the silicon is displaced laterally approximately the same distance as it is displaced vertically. In the case of silicon that has been implanted and annealed, the lateral displacement is much less than the vertical displacement.

(5) Top surface cleaning

The silicon nitride mask and any residual silicon material are next removed from the surface of the substrate.

(6) Back side lapping

If the substrate is to be mounted with the epitaxial side up, the back side of the substrate is thinned to allow better heat transfer to the heat sink that the OCL device is mounted on. The typical finished thickness of the substrate after thinning is 75 $\mu$m to 100 $\mu$m.

If the OCL device is mounted epitaxial side down on the heat sink, then thinning of the substrate is not necessary.

(7) Back side metallization

The typical device has the back side of the substrate fabricated from n type semiconductor material. As such, the deposited metallization must be n type ohmic.

(8) Dielectric deposition

Depending on the choice of the impurity and the resulting doping profile from the impurity, a dielectric may be required to electrically insulate areas of the top side of the substrate. The areas of substrate that are over the OCL device must be open for contact to the top side metalization.

(9) Photoresist deposition and patterning for dielectric patterning

Photoresist is deposited and patterned as required for the top side dielectric patterning mask.

(10) Top side dielectric patterning (a) Note: Steps 8-10 assume that the patterning of the dielectric is via etching. If the dielectric can be patterned by a lift-off process, then steps 8 and 9 can be reversed.

(b) Etch or lift-off dielectric as appropriate for patterning. Prepare top surface for next step.

(11) Photoresist deposit and patterning for top metal contact patterning.

(12) Top contact metal deposition

The typical device has the top side of the substrate fabricated as p type semiconductor material. As such, the deposited metallization must be p type ohmic.

(13) Top contact patterning via lift-off

The metalization pattern for the top contact is accomplished by performing a lift-off of the unwanted metal after step 12.

(14) Separation of individual devices

The individual devices are separated from the wafer by sawing or cleaving out the individual devices as required. Devices are sawed out of the wafer when edge quality is not important. If edge quality is important, the individual devices are separated from the wafer by cleaving.

(15) Mounting of individual devices

The individual devices must be mounted in such a way as to allow operation of the devices. This requires an appropriate choice of mounting header. Typically, the mounting header acts as both the heat sink and as one electrical contact to the device. A standard method of fastening the device to the header is via soldering.

(16) Electrode contacting to top and bottom contacts of individual devices.

The top contact can be accomplished by either wire bonding or probe contacting. The bottom contact is typically done through the device mounting header.

While in accordance with the provisions of the patent statute the preferred forms and embodiments of the invention have been illustrated and described, it will be apparent to those of ordinary skill in the art that various changes and modifications may be made without deviating from the inventive concepts set forth above.

What is claimed is:

1. An optically controlled semiconductor laser for performing digital logic functions, comprising
    (a) a material dependent index guided single mode laser diode device including a lasing cavity having a longitudinal axis and refractive index variations that support only a single mode of operation, said laser device generating laser media within said cavity in a direction parallel with said axis;
    (b) means for optically coupling light into said lasing cavity at an angle greater than the numerical aperture of said laser device, said coupled light interacts with said laser media within a region of said laser cavity and introduces a pertubation in the form of a non-uniformity within said waveguide laser cavity thereby quenching the output to alter the output of said laser device, whereby input of the coupled light enables the laser device to perform logic functions.

2. Apparatus as defined in claim 1, wherein said means for coupling light into said lasing cavity comprises an optical waveguide.

3. Apparatus as defined in claim 2, wherein said coupling optical waveguide is an active device.

4. Apparatus as defined in claim 2, wherein said coupling optical waveguide is a passive device.

5. Apparatus as defined in claim 2, wherein the length of the interaction region within said lasing cavity corresponds with the width of said optical waveguide.

6. Apparatus as defined in claim 5, wherein said coupling optical waveguide is arranged normal to the axis of said lasing cavity and has a width substantially less than the length of said cavity.

7. Apparatus as defined in claim 5, wherein a plurality of said index guided single mode laser diode devices are interconnected, whereby a variety of logic functions are performed.

8. Apparatus as defined in claim 7, wherein said coupled light has a wavelength similar to the center wavelength of the laser radiation, and a peak wavelength within the spontaneous emission bandwidth of the laser radiation.

9. Apparatus as defined in claim 1, wherein said light coupling means comprises at least first and second optical waveguides for coupling first and second light beams into said lasing cavity.

* * * * *